United States Patent [19]

Yamasaki

[11] 4,378,504

[45] Mar. 29, 1983

[54] PROXIMITY SWITCH

[75] Inventor: Hiroyuki Yamasaki, Kyoto, Japan

[73] Assignee: Omron Tateisi Electronics Co., Kyoto, Japan

[21] Appl. No.: 365,039

[22] Filed: Apr. 2, 1982

Related U.S. Application Data

[63] Continuation of Ser. No. 133,785, Mar. 25, 1980, abandoned.

[51] Int. Cl.³ .................... H01H 47/02; H01H 35/00
[52] U.S. Cl. ...................................... 307/99; 307/116
[58] Field of Search ............. 307/99, 116; 324/61 QS

[56] References Cited

U.S. PATENT DOCUMENTS 3,801,799 4/1974 Atkins ................................ 307/116

Primary Examiner—Donald A. Griffin
Attorney, Agent, or Firm—Wegner & Bretschneider

[57] ABSTRACT

A high-frequency oscillation type proximity switch comprising a resonance circuit in which a detection coil is used as a pickup for sensing the approach of an object thereto and a resonance capacitor is disposed at a position very close to the detection coil so that the resistance of a cable connecting the resonance circuit to its associated oscillation circuit can be substantially ignored in the resonance circuit.

9 Claims, 4 Drawing Figures

PROXIMITY SWITCH

This application is a continuation of application Ser. No. 133,785 filed Mar. 25, 1980 and now abandoned.

BRIEF SUMMARY OF THE INVENTION

The present invention relates to a proximity switch including a high-frequency oscillation circuit, and more particularly to a compact proximity switch.

A high-frequency oscillation type proximity switch is well known which comprises a detection coil, a capacitor connected to the detection coil to form a resonance circuit, and an oscillation circuit connected to the resonance circuit, in which the impedance of the resonance circuit varies on approach of an object to be detected by the proximity switch. The capacitor is mounted on a printed circuit board together with the oscillation circuit and is connected to the detection coil via cables, e.g., litz wires or fine solid wires. A litz wire consists of a number of separately insulated strands woven together and its resistance increases on breakage of even a single strand to the extent that it cannot be ignored for the performance of a resonance circuit. The fine solid wires also have the disadvantage that the wires are easy to break and, moreover, because of their fine diameters, have a large resistance which cannot be ignored in the resonance circuit. Generally, since such a proximity switch detects an approaching object based on a change of impedance in the resonance circuit, a large resistance of the cable means an increased equivalent loss in the detection coil and dulls the sensitivity of the proximity switch. The above-mentioned disadvantages originating from the cables are accentuated when the well known proximity switch is miniaturized.

Moreover, in addition to said resonance circuit, the proximity switch includes other high impedance circuit components which are very sensitive to external noise and these components are desirably shielded electrostatically with cover means. Provision of such cover means increases the size of the complete switch.

It is, therefore, a primary object of the present invention to provide a proximity switch comprising a resonance circuit in which a resonance capacitor is disposed at a position very close to a detection coil so that the resistance of a cable connecting the resonance circuit to its associated oscillation circuit can be substantially ignored in the resonance circuit.

It is a further object of the present invention to provide a compact proximity switch which is small in size and highly stable against and resistant to mechanical shock.

It is another object of the present invention to provide a proximity switch which is shielded against external noise.

Other objects and advantages of the present invention will be apparent upon reference to the following description in conjunction with accompanying drawings, in which:

DETAILED DESCRIPTION

Figure 1:
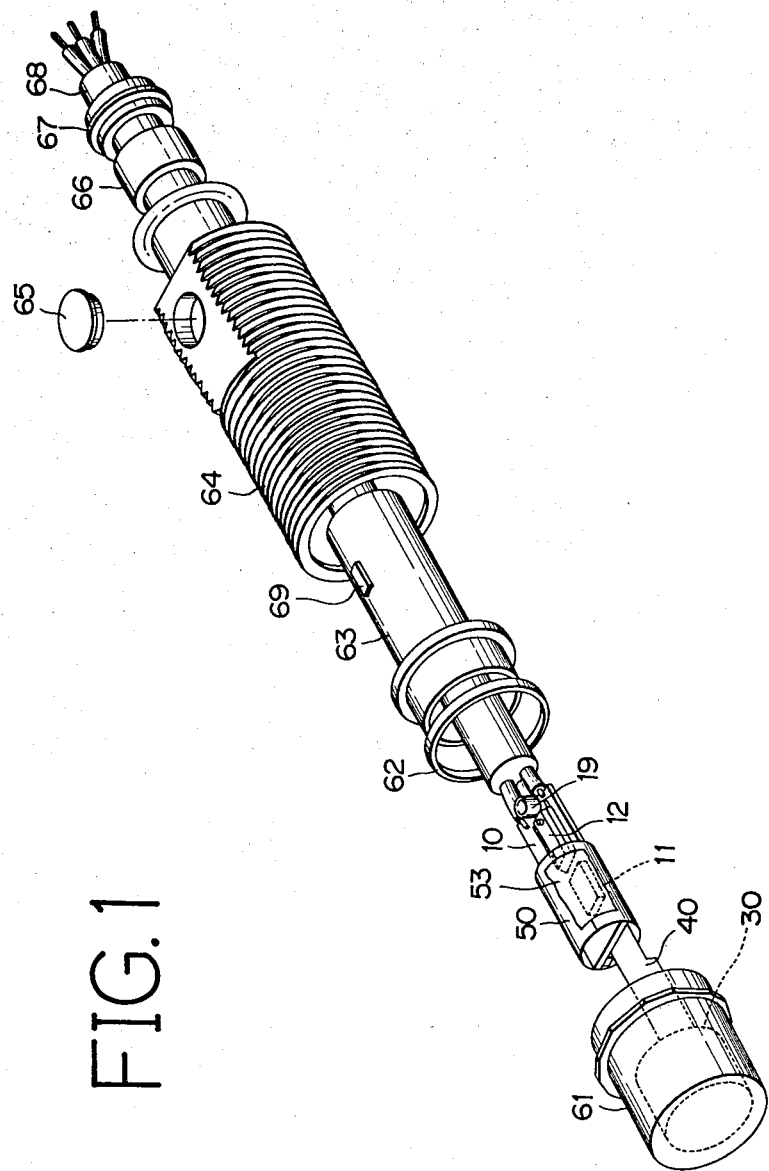
FIG. 1 is a perspective disassembled view of a proximity switch as a preferred embodiment of the present invention.

Referring, now, to FIG. 1, there is shown a proximity switch as a preferred embodiment of the present invention. The proximity switch comprises a cover 61 enclosing a resonance circuit component 30, a connection cable 40 and a printed circuit board 10. The board 10 is wrapped around with an electrostatic shield sheet 50 and enclosed in an insulating cylinder 63. The cover 61 is filled up with resin cement to firmly hold the resonance circuit component 30 therein. The cover 61 is coupled to the insulating cylinder 63 and a base metal housing 64 through a rubber gasket 62. The circuit board 10 carries as mounted thereon a light emitting diode 19, the light output thereof being allowed to emerge from an indication window 65 which is provided in the housing 64 through a transparent window 69 in said insulating cylinder 63. An output cable 68 is fixed to the base metal housing through a rubber sleeve 66 and a ring 67. The board 10 further carries a pair of integrated circuit packages 11 and 12 and other circuit components. The electrostatic shield sheet 50 and connection cable 40 are made of a single continual flexible sheet and the printed circuit board 10 is wrapped in said electrostatic shield sheet 50 which is secured in position, for example with an adhesive tape 53. Preferably the board 10 is secured to the cable 40 near the junction between the cable 40 and shield sheet 50, for example by soldering.

Figure 2:
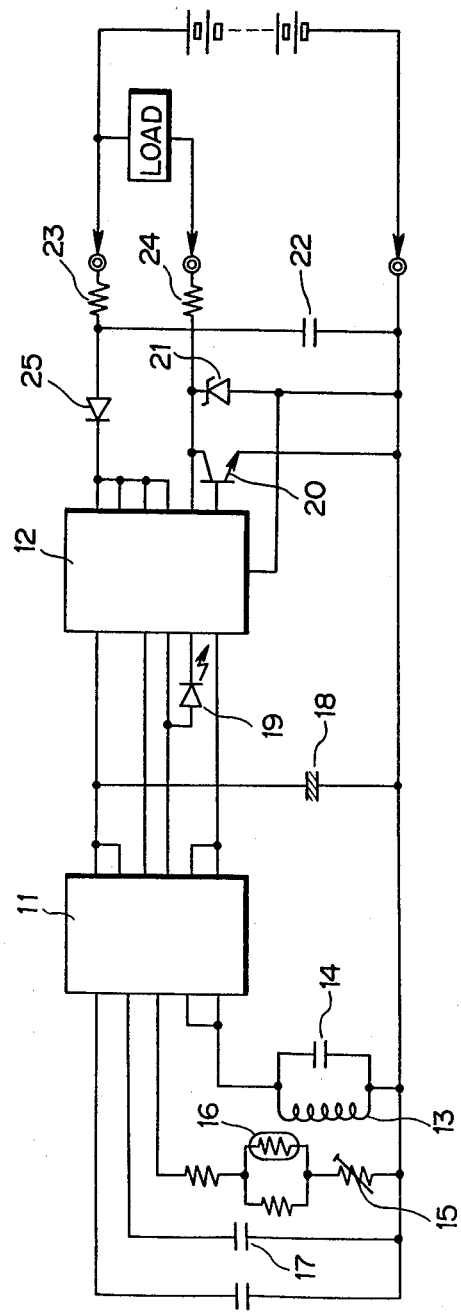
FIG. 2 is a schematic circuit of the proximity switch of FIG. 1.

In FIG. 2, there is shown an electronic circuitry of the proximity switch of FIG. 1. The integrated-circuit 11 is connected to a detection coil 13, a resonance capacitor 14, a variable resistor 15 for adjusting the sensitivity of the proximity switch, a temperature compensation thermistor 16, an integration capacitor 17 and so forth. The detection coil 13 and capacitor 14 constitute a parallel resonance circuit, viz. the resonance circuit component 30. The integrated-circuit 11 serves as an oscillation-and-signal process circuit. A capacitor 18 is interposed as a power smoothing condenser. The light emitting diode 19 is interposed to display the detection status of the proximity switch. The integrated-circuit 12 is an output circuit which drives an output transistor 20. A Zener diode 21 is interposed to absorb an electrical surge. A further capacitor 22 and resistors 23 and 24 are designed to absorb electrical surges and protect the circuit of FIG. 2 as a whole.

Figure 3:
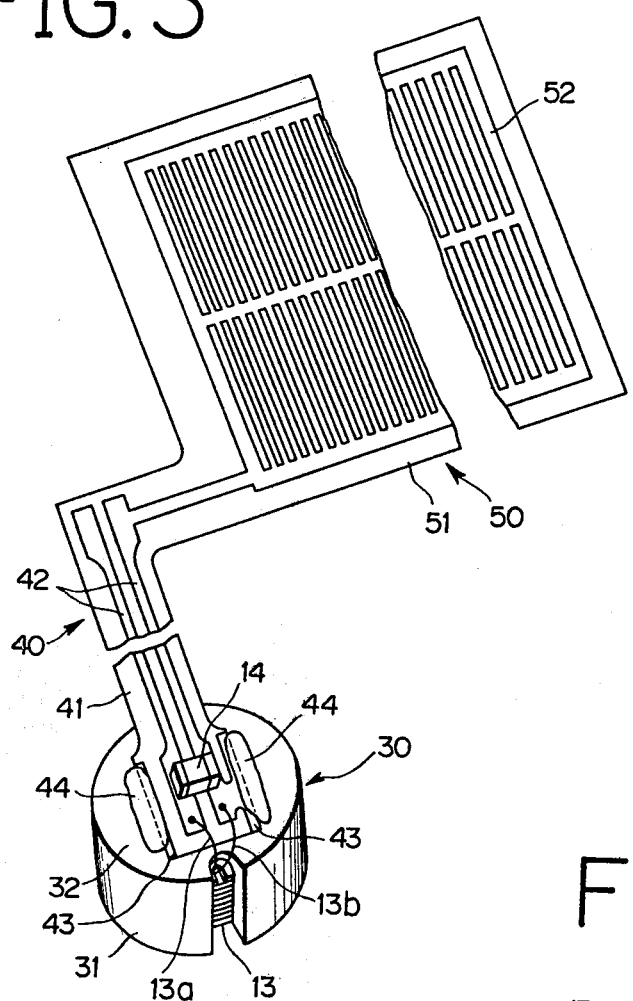
FIG. 3 is a disassembled view showing a resonance circuit component and an electrostatic shield sheet which are employed in the proximity switch of FIG. 1.

FIG. 3 is a pre-assembly diagram showing the electrostatic shield sheet 50, connection cable 40 and resonance circuit component 30 of the proximity switch of FIG. 1. The detection coil 13 is wound around an insulation bobbin (not shown) and embedded in a cavity of a core 31 made of a ferrite material. The core 31 is covered with a vapor-deposited metal film on the outer surfaces thereof including its back surface 32 and side wall surface. The vapor-deposited film consists of a base layer of chrome (Cr) and a surface layer of palladium (Pd), and its thickness as a whole is between about 600 and 2000 A. The connection cable 40 comprises an insulating flexible film sheet 41, a pair of conductive leads 42, and a pair of conductive leads 43 for fixing one end of the cable 40 to the core 31. The leads 43 are soldered to a portion of the vapor-deposited metal film on the back surface 32 so as to fix one end of the cable 40 to the surface 32. The leads 42 and 43 are fixed to the flexible sheet 41, and may be formed by the conventional method of producing printed circuit boards. Thus, as the vapor-deposited metal film formed on the outer surfaces of the core 31 is electrically connected to a ground line of the circuit of FIG. 2, the metal film electrostatically shields the components enclosed in the core 31.

The pair of leads 42 are connected, at each one end thereof, to ends of a pair of leads 13a and 13b of the detection coil 13, respectively. Further, the resonance capacitor 14, of a chip type, is connected across the ends of the leads 42.

As already mentioned, the electrostatic shield sheet 50 is formed with the connection cable 40 as a single unit. Thus, the sheet 50 is actually an insulating flexible film sheet 51 on which a conductive lattice pattern has been printed and the connection cable 40 is actually an extension of the above film 51, indicated at 41, which carries said leads 42. The conductive lattice pattern 52 and leads 42 are formed simultaneously and in electrically interconnected connecting relation. The conductive lattice pattern has slits which are longer along the wrapping axis of the sheet 50, viz. the longitudinal axis of the switch of FIG. 1, and are short in length in the direction perpendicular to the wrapping axis so that the sheet 50 can be easily wrapped around the printed circuit board 10 on assembling. The flexible film sheet 51 is made of polyamide or polyester and about 10 microns in thickness. The conductive patterns 52, 42 and 43 may be formed with silver foil, by the vapor deposition of a metal such as Ni, Al or Pd or with a conductive coating material.

According to the present embodiment, there is provided a compact proximity switch which is small in diameter. The outside diameter of the cover 61, for instance, may be 8 mm. The lead cable 40 and the electrostatic shield sheet 50 are formed as a single unit, the conductive pattern 52 being continuous with one of the leads 42, so that the handling of the cable 40 and sheet 50 in assembling is simplified, the number of soldered points is reduced and, hence, the assembling efficiency is improved, the reliability of the proximity switch is increased, the production cost is reduced, and the switch is minituarized. The cable 40 is a flexible printed circuit sheet, so that the leads 42 are prevented from being undesirably broken by a mechanical force, the electrical resistance of the leads 42 is reduced, and the capcitance between the leads 42 is minimized. The resonance circuit consisting of the capacitor 14 and coil 13 is a parallel resonance circuit which has a high impedance when resonance occurs, so that the resistance of the leads 42 can be virtually disregarded. It is desirable that the respective surfaces of the conductive pattern 52 and the cable leads 42 except connection points thereof, are covered with an insulating coating of epoxy resin or the like.

Figure 4:
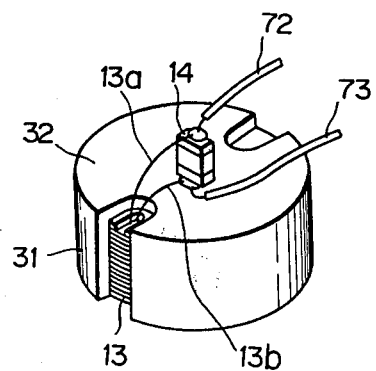
FIG. 4 is a schematic view showing a modified resonance circuit component which may be employed in the proximity switch of FIG. 1.

In FIG. 4, there is shown a modified resonance circuit component which may be employed in the proximity switch of FIG. 1. In the present embodiment the cable which connects the resonance circuit component with its associated circuit including the oscillation circuit comprises ordinary insulated wires 72 and 73. One electrode of the chip-type capacitor 14 is soldered to the back surface 32 through the vapor-deposited metal film layer on the surface 32, whereas the opposite electrode thereof is insulated from the back surface 32. Both ends of the capacitor 14 are used as common connection terminals for the leads 13a and 13b and cable wires 72 and 73, so that the number of parts to be assembled is reduced.

As another modified resonance circuit component which may be employed in the proximity switch of FIG. 1, the resonance capacitor 14 may be disposed on the back surface 32 of the core 31 as shown in FIG. 3, but one electrode of the capacitor 14 is directly soldered to the vapor-deposited metal layer of the back surface 32 while the opposite electrode is insulated from the back surface 32 by an insulated material, such as an insulator film or any other insulating member. Alternatively, the capacitor 14 may be secured to the core 31 by means of an electrically insulated adhesive material. Moreover, the capacitor 14 may be a tublar capacitor or any other type capacitor only if it is small enough to be fixed to the outer surface of the core 31. The resonance circuit component 30 may be such that the coil 13 is wound around a core having a modified configuration, e.g. a bobbin-type core.

The proximity switch according to this invention is characterized by a resonance circuit formed by a resonance capacitor and a detection coil as located together in close proximity to each other and, consequently, a reduced length of cable connection between the resonance circuit and its associated oscillation circuit. The above arrangement makes for a reduced loss in the resonance circuit, and hence ensures a stabilized resonance status and an increased sensitivity of the switch. It is to be understood that though the resonance circuit in the above embodiments is described as a parallel resonance circuit, the resonance circuit may be a serial resonance circuit where the resonance capacitor is connected to the detection coil in series.

It should also be understood that the above description is merely illustrative of the present invention and that many changes and modifications may be made by those skilled in the art without departing from the scope of the appended claims.

What is claimed is:

1. A proximity switch, comprising:
   a detection coil having a core, said core having a front and a back surface;
   a capacitor disposed on the back surface of said core and electrically connected to said detection coil to form a resonance circuit;
   an oscillation circuit is operative connection with said resonance circuit;
   an electrostatic shield surrounding said oscillation circuit;
   a long, narrow, insulating member;
   said resonance circuit and said oscillator circuit with said shield being arranged in a narrow, linear relationship and being disposed inside of said insulating member;
   a narrow housing, said resonance circuit, oscillation circuit, electrostatic shield, and insulating member comprising a single assembly disposed within said housing.

2. The proximity switch of claim 1, wherein said capacitor is of a chip type and fixed to said back surface of the core.

3. The proximity switch of claim 2, further comprising a connection wire and wherein an electrode of said capacitor is used as a terminal via which said connection wire provides an electric connection between said resonance circuit and said oscillation circuit.

4. The proximity switch of claim 1, wherein said electrostatic shield is formed on a flexible sheet.

5. The proximity switch of claim 4, wherein said flexible sheet provides the operative electrical connection between said resonnance circuit and said oscillation circuit.

6. The proximity switch of claim 5, wherein said capacitor is connected to said coil through said flexible sheet.

7. The proximity switch of claim 4, wherein said flexible sheet includes a conductive lattice pattern having of plurality of slits which are long along a wrapping axis of the sheet and short in a direction perpendicular to the wrapping axis.

8. The proximity switch of claim 1 wherein an outer surface of said core is covered with a vapor-deposited metal film so as to electrically shield said detection coil.

9. The proximity switch of claim 1, including a circuit for processing output signals from said oscillation circuit.

* * * * *